US006944099B1

(12) United States Patent
Preuss et al.

(10) Patent No.: US 6,944,099 B1
(45) Date of Patent: Sep. 13, 2005

(54) PRECISE TIME PERIOD MEASUREMENT

(75) Inventors: Curtis Walter Preuss, Rochester, MN (US); Michael Launsbach, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 10/865,249

(22) Filed: Jun. 10, 2004

(51) Int. Cl.[7] ........................... G04F 8/00; G04F 10/00; G01R 23/02

(52) U.S. Cl. ....................... 368/113; 368/118; 368/120; 324/76.54

(58) Field of Search ......................... 368/113, 118–120; 324/76.52–76.55

(56) References Cited

U.S. PATENT DOCUMENTS

| | | | | |
|---|---|---|---|---|
| 3,576,532 A | | 4/1971 | Kaps | 340/146.2 |
| 3,753,111 A | | 8/1973 | Denbnovetsky et al. | 324/187 |
| 4,544,884 A | | 10/1985 | Hayashi | 324/78 |
| 5,337,335 A | | 8/1994 | Cloetens et al. | 375/120 |
| 5,694,377 A | * | 12/1997 | Kushnick | 368/120 |
| 5,764,045 A | | 6/1998 | Hayashi | 324/76.48 |
| 5,796,682 A | * | 8/1998 | Swapp | 368/120 |
| 5,818,797 A | * | 10/1998 | Watanabe et al. | 368/113 |
| 5,867,453 A | * | 2/1999 | Wang et al. | 368/120 |
| 5,903,522 A | * | 5/1999 | Carley | 368/118 |
| 6,081,484 A | * | 6/2000 | West | 368/120 |
| 6,501,706 B1 | * | 12/2002 | West | 368/118 |
| 6,597,213 B1 | * | 7/2003 | Weintraub | 327/122 |
| 6,741,522 B1 | * | 5/2004 | Lin | 368/118 |

OTHER PUBLICATIONS

Rahkonen, T., Kostamovaara, J., Saynajakangas, S., *Time Interval Measurements Using Integrated Tapped CMOS Delay Lines*, Proceedings of the 32nd Midwest Symposium, Circuits and Systems, pp. 202–204 (Aug. 14–16, 1989).

* cited by examiner

*Primary Examiner*—Vit W. Miska
(74) *Attorney, Agent, or Firm*—Karuna Ojanen

(57) ABSTRACT

Measurement of the period of a relatively slow but precise reference clock in terms of a high speed oscillating clock, such as from a voltage controlled oscillator (VCO). The reference clock is known to be accurate and stable and values of the time measurement unit are output that determine the integer and fractional number of the high speed oscillating clock periods which occurred during one reference clock cycle. The measurements are very accurate and all cycles of the reference clock are measured. Such measurements enable various frequency control schemes over the high speed oscillating clock source.

14 Claims, 8 Drawing Sheets

PRECISE TIME PERIOD MEASUREMENT

FIELD OF THE INVENTION

This invention relates generally to measuring time periods and more specifically, to a calibrated method and apparatus to measure the frequency of and retune a high speed clock in situ.

BACKGROUND OF THE INVENTION

Accurate time measurements using integrated tapped CMOS delay lines have been obtained in low voltage semiconductor environments. Rahkonen et al., *Time Interval Measurements Using Integrated Tapped CMOS Delay Lines, PROCEEDINGS OF THE 32$^{ND}$ MIDWEST SYMPOSIUM*, CIRCUITS AND SYSTEMS, pp. 202–204 (14–16 Aug. 1989) describe a time-to-digital converter wherein a start signal is propagated on a slow tapped delay line and a stop signal is propagated on an integrated relatively fast tapped delay line. The stop signal latches the output of the slow delay line and when the stop signal catches the start signal, the position of the start signal is detected by a coder and converted to a binary output word. Calibration of the time-to-digital converter is accomplished either by measuring a known time interval, calculating the tap size and scaling the results computationally, or by biasing adjustable delay elements to a proper unit delay. In any event, the calibration is dependent upon the environmental conditions affecting the delay lines and the flip-flops.

In order to continuously and accurately measure short time durations, on the order of hundreds of nanoseconds, within a reasonable tolerance on the order of fifty or fewer picoseconds, within changing environments and at low power, modification and calibration of the Rahkonen et al. device is required. Continuous measurements, moreover, permit in situ control of the high frequency oscillating signal.

SUMMARY OF THE INVENTION

These needs have been met by an apparatus and a method to accurately measure time periods in situ. The apparatus comprises a time measurement unit to receive an input of a reference clock and a high speed oscillating clock having a time period to be measured; the time measurement unit further comprising an edge-launcher that receives the rference clock and the high speed oscillating clock and in response thereto generates a plurality of signals; a plurality of fast delay units arranged in a fast delay line and a plurality of slow delay units arranged in a slow delay line, and a plurality of latches; the first of the slow delay units receiving a start signal generated by the edge-launcher, and the first of the fast delay units receiving a stop signal generated by the edge-launcher. One each slow delay unit is interconnected with one each latch to one each fast delay unit. The first of the slow delay units receives a second start signal and the first of the fast delay units receives a second stop signal to calibrate the time measurement unit. The time measurement unit further comprises a plurality of combinatorial logic, one combinatorial logic receiving the output of one latch; a linear-to-binary coder connected to the output of the plurality of combinatorial logic; a cycle counter having a plurality of counters; each counter to count and store the number of the high speed oscillating clock cycles within a time period of alternating reference clock cycles; and a register to store the output of the linear-to-binary coder and the cycle counter.

The time measurement unit measures the leading fractional edge as the time difference between a rising edge of the reference clock and the next rising edge of the high speed oscillating clock and a next leading fractional edge as the time difference from a next rising edge of the reference clock and a rising edge of the high speed oscillating clock immediately following that next rising edge of the reference clock. Counters in the cycle counter are reset on different cycles of the reference clock so that number of fractional and integral high speed oscillating clock cycles of the reference clock are measured and calibrated every reference clock cycle.

The method of the invention comprises measuring the time periods, the method comprising the steps of: inputting a reference signal and a high speed oscillating signal into an edge-launcher of a time measurement unit; launching a start signal generated from the reference signal by the edge-launcher down a slow delay line; launching a stop signal generated from the high speed oscillating signal down a fast delay line; calibrating the time measurement unit; determining when the stop signal catches the start signal; and counting the cycles of the high speed oscillating signal in each cycle of the reference signal. The time at which the stop signal catches the start signal is determined by sampling a latch connecting an output of a slow delay unit on the slow delay line and also connecting an output of a fast delay unit on the fast delay line, the sampling occurring when the stop signal arrives at each fast delay unit on the fast delay line. Calibration of the time measurement unit encompasses launching a second start signal on the slow delay line on a rising edge of the high speed oscillating signal but before a second rising edge of the reference signal, launching a second stop signal on the fast delay line on the next rising edge of the high speed oscillating signal after the second start signal is launched; and determining when the second stop signal on the fast delay line catches the second start signal on the slow delay line. Similarly, the determination of when the second stop signal on the fast delay line catches the second start signal on the slow delay line further comprises sampling a second output of a slow delay unit on the slow delay line as the second start signal traverses the slow delay units, the sampling taking place in a latch connecting the slow delay line and a fast delay unit on the fast delay line, the sampling of the second output occurring as the second stop signal travels down the fast delay line and catches the second start signal; and decoding the latch of the second output when the second stop signal catches the second start signal in a linear-to-binary coder to yield a calibration value. Counting is assured every cycle of the reference clock by enabling a first counter to count the number of cycles of the high speed oscillating signal in a first cycle of the reference signal, and storing a count in is a register, and then enabling a second counter to count the number of cycles of the high speed oscillating signal in a next cycle of the reference signal.

Other aspects and features of the present invention, as defined solely by the claims, will become apparent to those ordinarily skilled in the art upon review of the following non-limited detailed description of the invention in conjunction with the accompanying figures.

DETAILED DESCRIPTION OF THE INVENTION

The present invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough, complete, and will fully convey the scope of the invention to those skilled in the art. Like numbers refer to like elements throughout.

Figure 1:
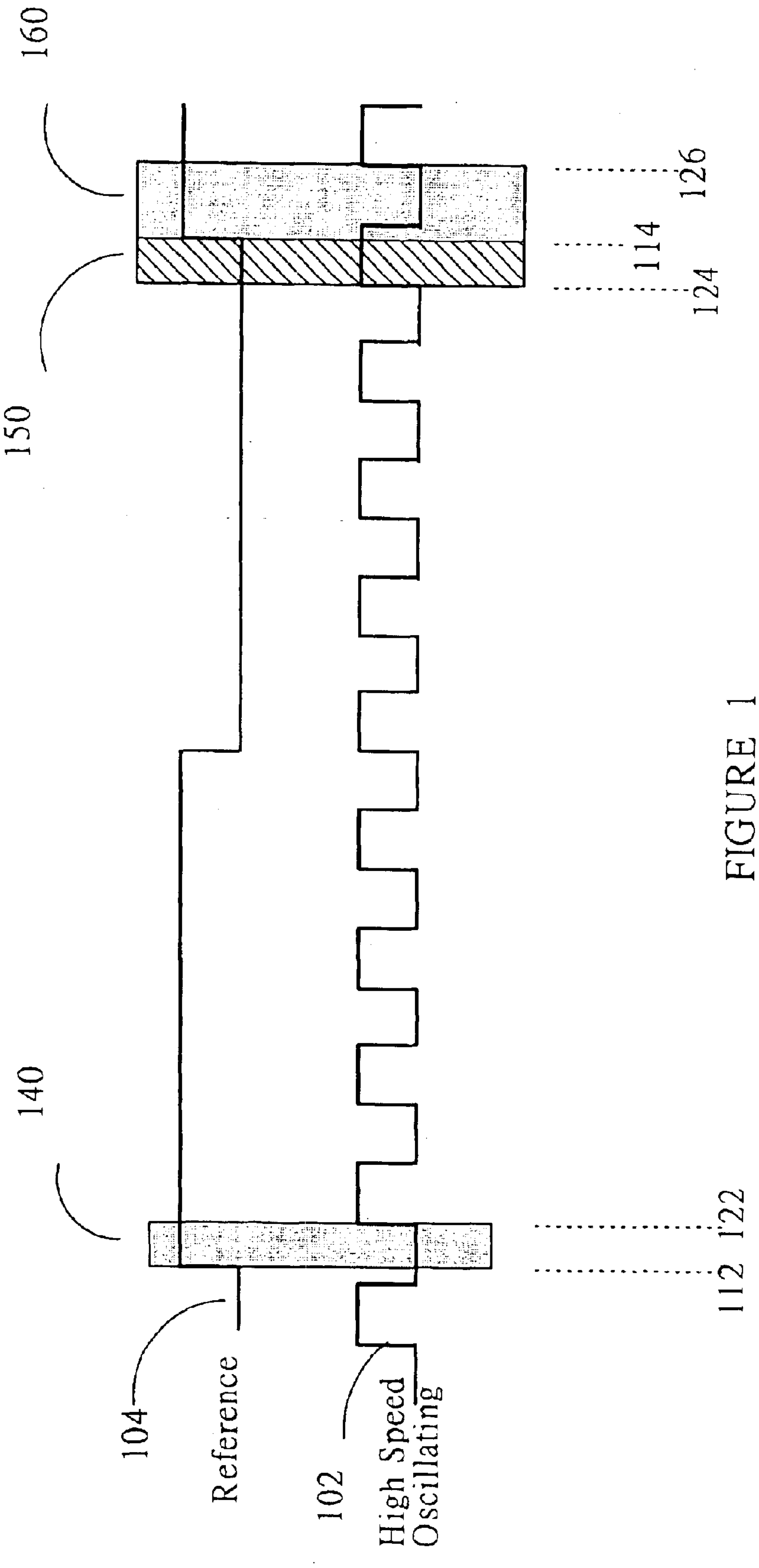
FIG. 1 is a simplified timing chart illustrating various waveforms of interest in the calculation of time measurements in accordance with an embodiment of the invention.

FIG. 1 is a simplified timing chart of an example of how the period of a slower reference clock can be measured in terms of a faster high speed oscillating clock. The reference clock is very accurate and, preferably, not responsive to the same environmental fluctuations as the high speed oscillating clock. At time 112, a rising edge of a reference clock 104 begins, and at time 122, a rising edge of the high speed oscillating clock 102 is initiated. The short time duration between the rising edge 112 of the reference clock 104 and the rising edge 122 of the high speed oscillating clock 102 is denoted the leading edge fraction 140 and is characterized as a fraction of the high speed oscillating signal 102. At time 114 later, another rising edge of the reference clock 104 propagates and at time 126, a leading edge of the high speed oscillating clock 104 immediately follows. Two fractional time periods can be determined directly and a third is indirectly inferred: first, the leading edge fraction 140 and the next leading edge fraction 160 can be directly determined; and the trailing edge fraction 150 represents that fraction of an incomplete cycle of the high speed oscillating clock 102 from its rising edge 124 until the second rising edge 114 of the reference clock 104. Knowing the next leading edge fraction 160, the trailing edge fraction 150 150 can be calculated, and then knowing the leading edge fraction 140, the trailing edge fraction 150, and the period of the reference clock 104 can be used to accurately measure the integral and fractional numbers of the high speed oscillating clock 102. In the preferred embodiment that effectively implements accurate programmable control of the high speed oscillating clock, all these measurements are very precise and all cycles of the reference clock are measured.

Figure 2:
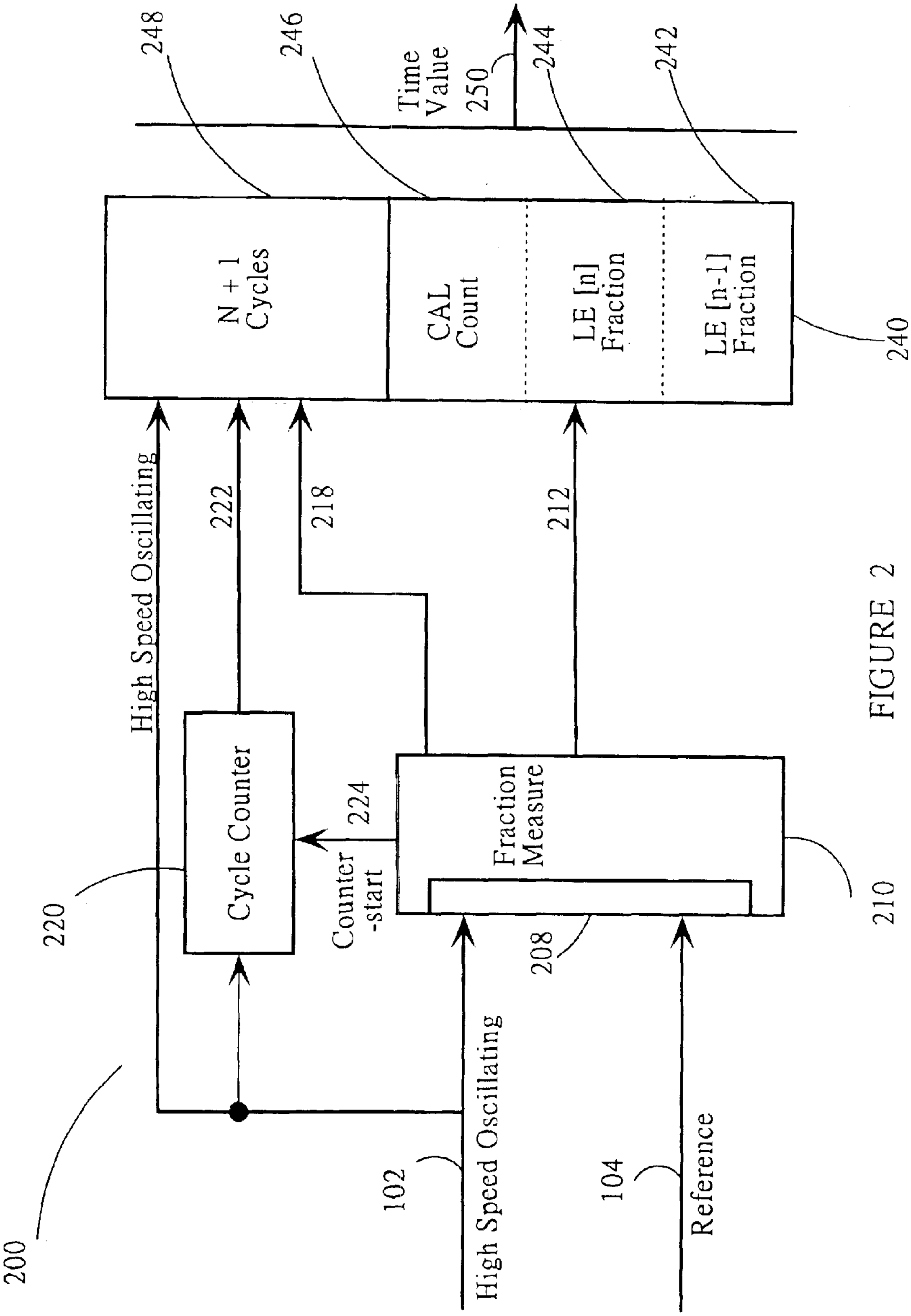
FIG. 2 is a simplified block diagram of a time measurement unit that can be used to obtain precise time measurements in accordance with an embodiment of the invention.

FIG. 2 is a simplified block diagram of the time interval measurement unit 200 that measures the period of the precise reference clock 104 in terms of a high speed oscillating clock 102. The high speed oscillating clock 102 may be derived from, e.g., a voltage controlled oscillator (VCO), although other programmable sources of high frequency clocks are known to those of skill in the art. The reference clock 104 is output from precision oscillator (not shown) that preferably is not responsive to the same environmental fluctuations as the time measurement unit 200. The high speed oscillating clock 102 and the reference signal 104 are input to an edge-launcher 208 within the fraction measure block 210 of the time measurement unit 200. The edge-launcher 208 is a long shift register clocked by the high speed oscillating clock 102 whose first data input signal is the reference clock 104. The edge-launcher 208 generates a variety of edges based on the high speed oscillating clock 102 and the reference clock 104, including a stop signal from the high speed oscillating clock 102 and a start signal from the reference clock 104, and other signals depending on the state of the shift register, as discussed herein. The high speed oscillating clock 102 is also input into a cycle counter 220 and a temporary storage register 240.

The time interval measurement unit 200 further comprises a fraction measure block 210, a cycle counter 220, and a temporary storage register 240. The cycle counter 220 measures and outputs 222 the integral number of fast cycles while the fraction measure block 210 measures the fractions of the fast signal. The cycle counter 220 is further described with respect to FIG. 5; the fraction measure block is further described with respect to FIG. 3; and features of both are described with respect to FIG. 4.

The fraction measure block 210 measures the edges and fractions of the waveforms output from the edge-launcher 208 as described herein and provides a binary value output 212 of the leading edge fraction 242, the next leading edge fraction 244; and a binary calibration count 246. In the preferred embodiment, these three time intervals are measured for each cycle of the slow signal as described below. Output save-all 218 is a save-all signal that preserves the state of the fraction measure block 210 and the cycle counter 220.

Figure 3A:
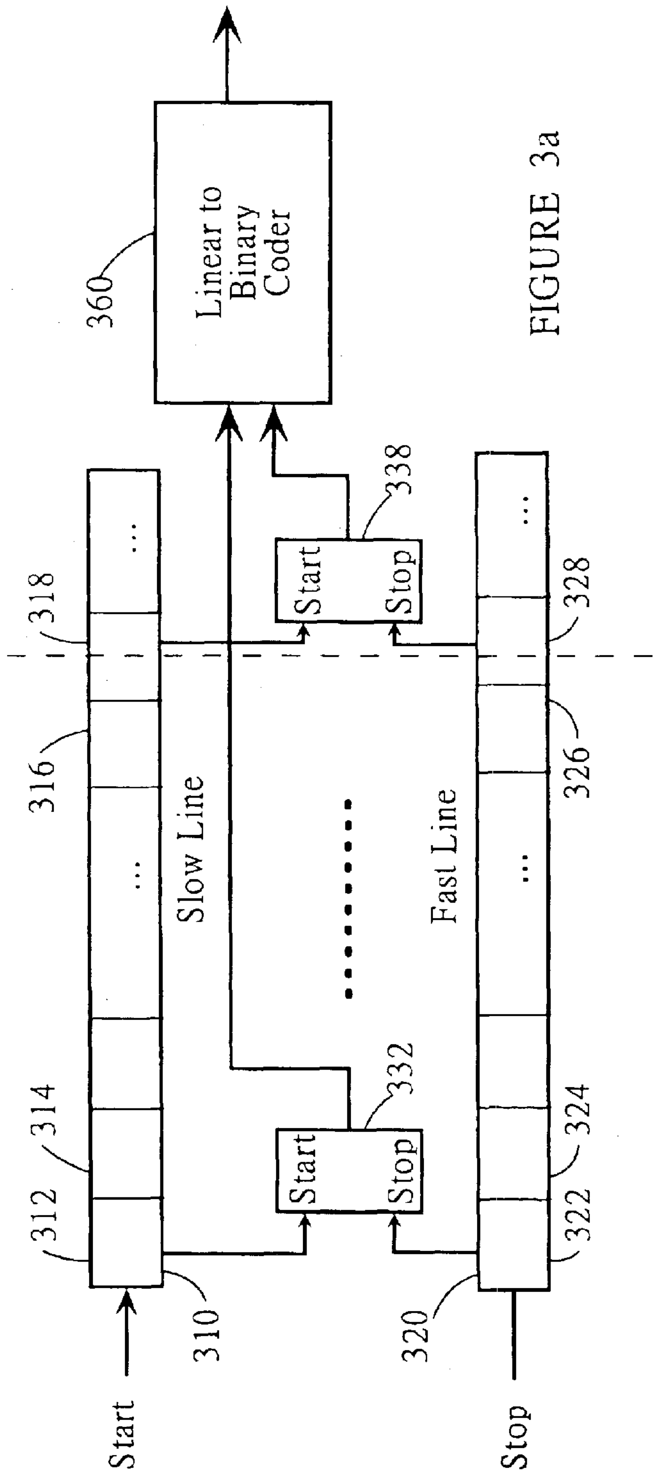
FIG. 3*a* is a simplified block diagram of features of the fraction measure block in the time measurement unit illustrating two delay lines and latches.
Figure 3B:
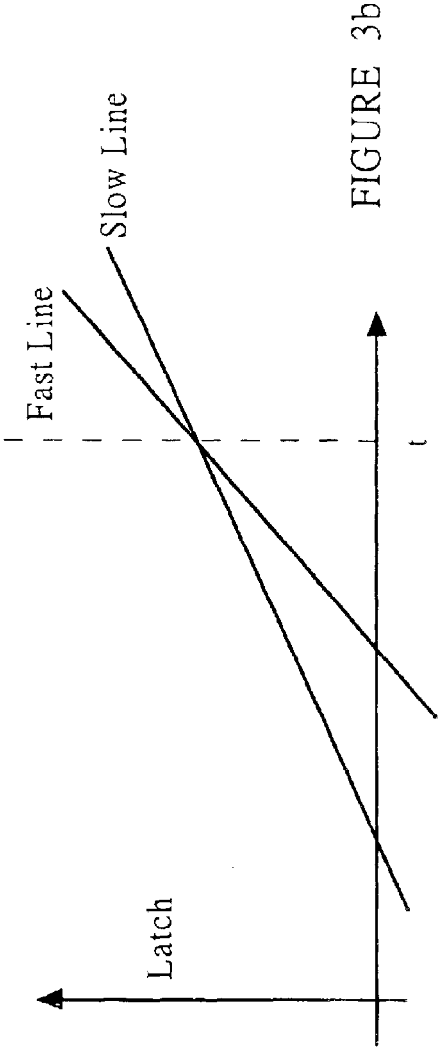
FIG. 3*b* is a graph of the latch number and the time of a pulse down each delay line.

The fraction measure block 210 contains components as shown in FIG. 3*a* and comprises two tapped delay lines 310 and 320. Each delay line comprises the same number of many delay units, on the order of tens, hundreds, or thousands, depending upon the time measurements. One delay unit of each line provides an input into a corresponding flip-flop or latch 332; there are as many latches 332 as there are delay units on a single delay line. One latch 332 then receives the output of delay unit 312 of the slow delay line 310 having the start signal 110 and the output of delay unit 322 of the fast delay line 320 having the stop signal 120. The number of delay units, the time difference between a delay unit on the slow delay line and a delay unit of the fast delay line, and size of the delay units and time duration of each delay are design requirements that can be varied depending upon the resolution desired of the time interval. In one embodiment, each delay unit 312, 314 . . . 316, 318 on the slow delay line 310 provided a delay on the order of seventy picoseconds and each delay unit 322, 324 . . . 326, 328 on the fast delay line 320 provided a delay on the order of fifty picoseconds; thus the time measurement unit 200 was able to detect two percent variation of the high speed oscillating clock 102. First, a rising edge of the start signal 110 is launched from the edge-launcher 208, a first stop signal 120 is then propagated on the fast tapped delay line 320. As the stop signal 120 passes through its corresponding delay units 322, 324 . . . 326, 328 on the fast delay line 320, the output of the corresponding slow delay unit 312 . . . 318 captured in its corresponding latch 332 . . . 338 is sampled. While the start signal 110 is still ahead of the stop signal 120, latches 332 . . . 338 output a binary 1. At a time t, however, illustrated as being at delay units 318, 328 on the slow delay line 310 and the fast delay line 320, respectively, the stop signal 120 catches and passes the start signal 110. This time t is represented in FIG. 3*b* as the intersection of the slow line and the fast line that has the steeper slope; then latch 338 will output a binary O.

Figure 4:
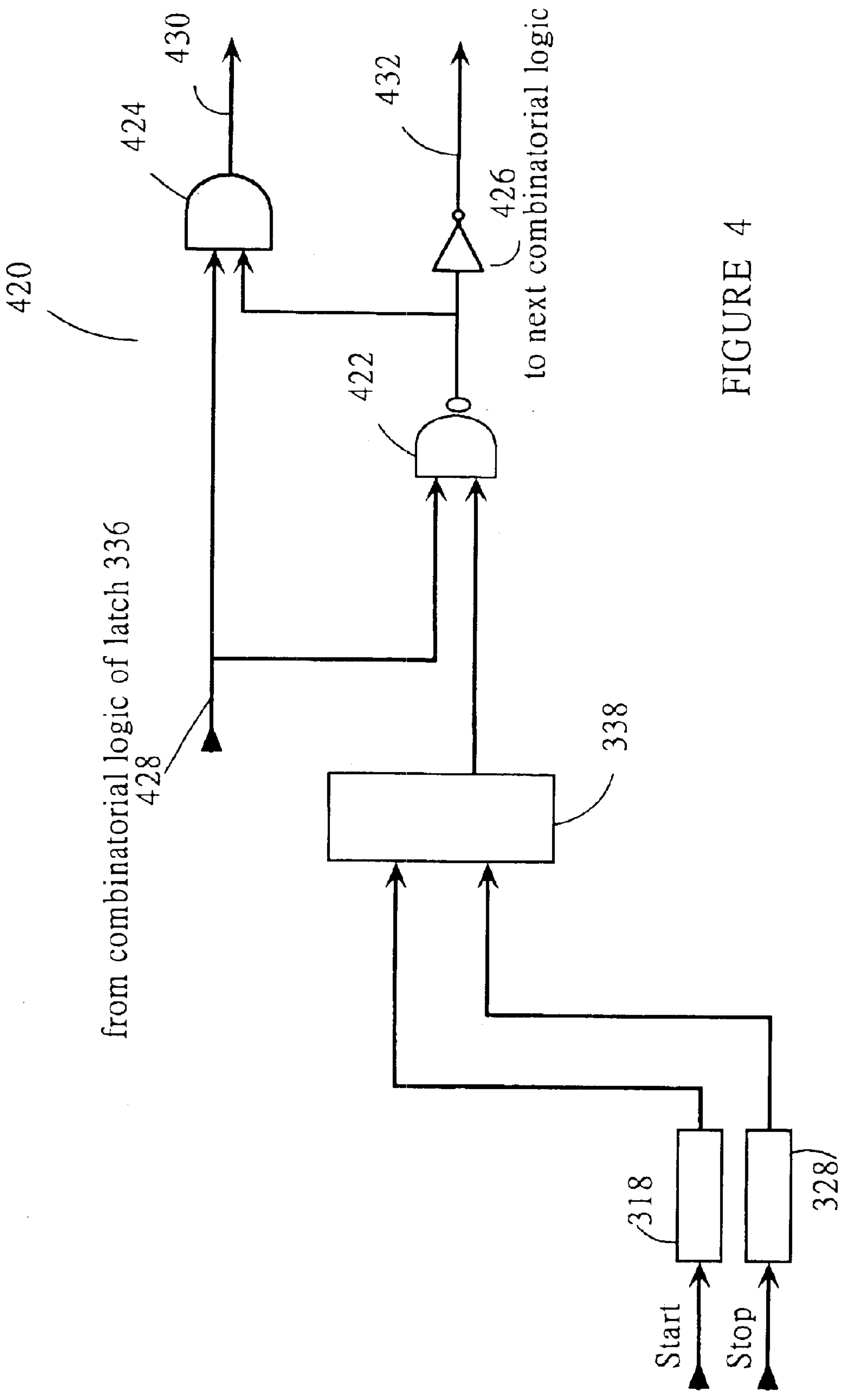
FIG. 4 is a simplified logic diagram of an example of combinatorial logic that can be used to obtain accurate time measurements using delay lines.

FIG. 4 is a more detailed block diagram of aspects of the fraction measure block 210 of FIG. 2 and the delays lines 310, 312 and latches 332 . . . 338 of FIG. 3. Each delay unit 312, 314 . . . 316, 318 on the slow delay line 310 may comprise a pair of slow inverters whereas each delay unit 322, 324 . . . 326, 328 on the fast delay line 320 may comprise a pair of fast inverters. One of skill in the art will know that by choosing the size of the transistors in the delay units, the delay and speed of switching can be controlled; and that there are methods other than the use of inverters to implement accurate delay lines. Output from the second inverter of both delay units 318, 328 are input to latch 338. As discussed earlier, when the start signal is ahead of the stop signal, output from latch 338 is 1, but when the stop signal passes the start signal, output of latch 338 is 0. Output from latches 332 . . . 338 are input into the combinatorial logic 420. In accordance with an embodiment of the invention, there are multiple combinatorial logic units, one combination logic for each latch 338. Combinatorial logic 420 may be a component of the linear-to-binary coder 360, although it is illustrated in FIG. 4 for ease of understanding the invention.

Combinatorial logic 420 comprises a NAND gate 422, an AND gate 424 and an inverter 426. Thus for each latch 332 . . . 338, there is a corresponding NAND gate 422, AND gate 424, and inverter 426 arranged as in FIG. 4. One skilled in the art will also recognize that logic can be configured differently to achieve the same results. Input to a NAND gate 422 include the output of the current current latch 338 and the output 428 from the previous latch 336. The output of NAND gate 422 is 0 only when the stop signal has not yet passed the start signal clock. The output 428 from a previous latch 336 and the output from the NAND gate 422 are input to AND gate 424 which results are output at 430 to a series of OR gates of the linear-to-binary coder 360. Output 430 signals if the current latch 338 sampled a 0 and all previous latches sampled a 1. Thus, only one latch provides a binary 1 to the OR gates of the linear-to-binary coder 360. Another output of NAND gate 422 is input through inverter 426 to become input 428 of the next latch.

The linear-to-binary coder 360 comprises multiple OR gates. There is one OR gate for each binary output bit, thus if the output is an eight-bit binary number, there are eight OR gates. Of course, the number of bits required for the binary number is dependent upon the number of discrete delay units in the delay lines. Eight bits will accommodate up to 128 delay units in each line; nine bits will accommodate up to 256 delay units, and so on. Inputs to each OR gate are selected outputs 430 of the AND gates 424 corresponding to each latch 332 . . . 338. For example, the output 430 of the AND gate corresponding to the fifth latch is wired to the OR gate feeding bits 0 and 2 of the binary number; the output of the seventh AND gate of the seventh latch is wired to the OR gate feeding bits 0, 1, and 2. Thus, again, depending upon the resolution and the number of delay units, each OR gate may have tens, hundreds, or more inputs. As explained above, only the current latch 338 at which the sampled output changed from 1 to 0 will output a logic high into the linear-to-binary coder 360, all the other outputs will be low. Thus, the linear-to-binary coder 360 converts the passing delay number 318, 328 to a binary integer.

Figure 5:
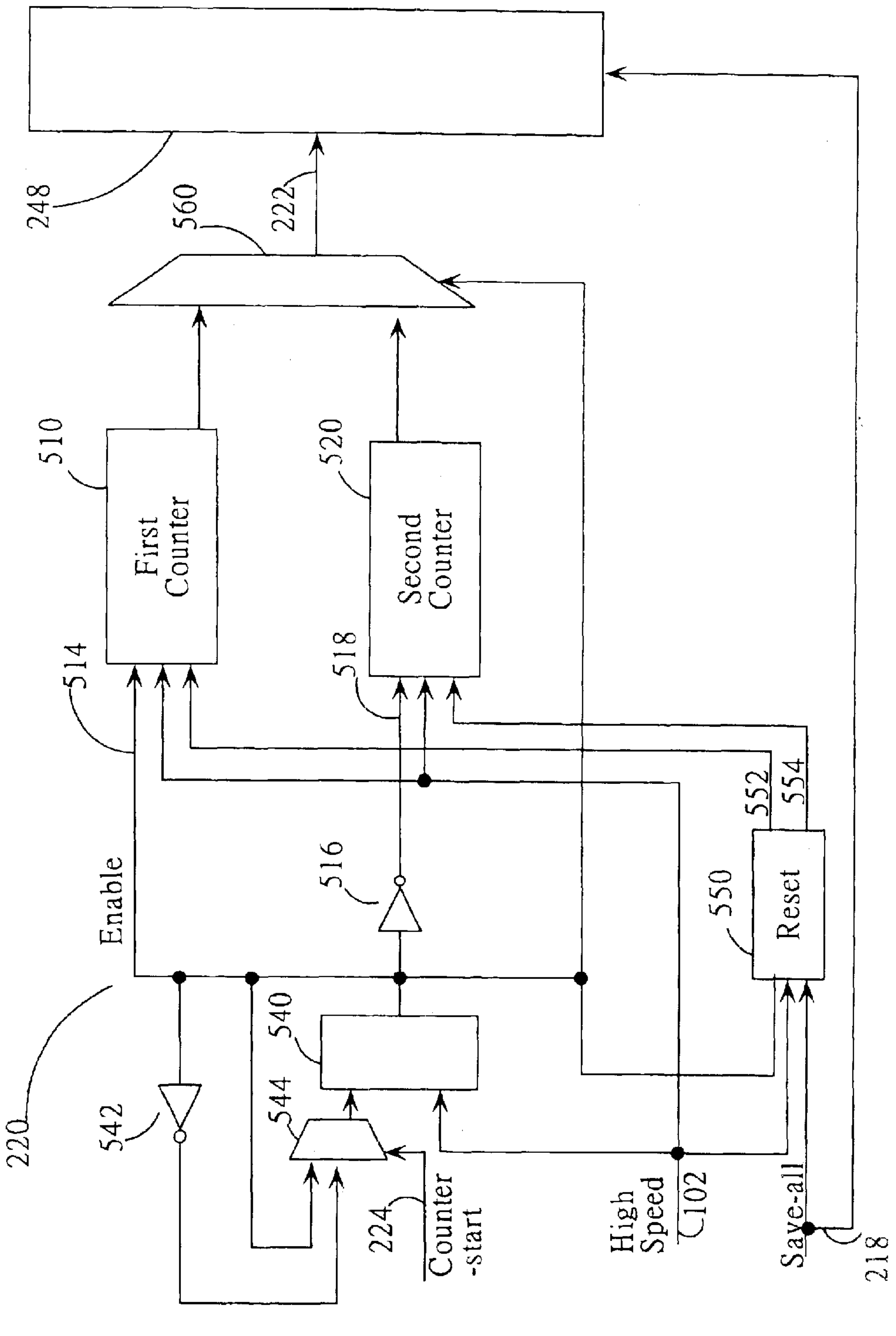
FIG. 5 is a simplified block diagram of features of the cycle counter of the time measurement unit in accordance with features of the invention.

Changing now to the contents and the operation of the digital counter 220 shown in FIG. 5. The use of a single counter as the cycle counter is difficult to implement because the value in the counter has to be stored during the same cycle that the counter is being reset. To remediate this concern, two counters have been implemented which simplifies storing and resetting the counter value and measures every cycle of the reference clock. The digital counter 220 counts the integer number of high speed oscillating clock 102 that occur during every cycle of the reference clock 104. The cycle counter 220 preferably has two synchronous counters 510, 520 whose inputs are the high speed oscillating clock 102 and a counter-start pulse 224 output from the fraction measure block 210 in response to the input reference signal 104. The counter-start pulse 224 causes multiplexer 544 to pass the output of inverter 542 to flip-flop 540 which toggles enable signal 514, 518. Enable signal 514 is input to the first counter 510 on a first reference clock 104. On the next cycle of the reference clock 104, another counter-start pulse 224 toggles flip-flop 540 to provide a second enable signal 518 to the other counter 520. While the first counter 510 is counting the whole number of high speed oscillating clock cycles 102, the second counter 520 holds its count value of the high speed oscillating clocks during its cycle of the reference clock. Upon enable signal 514 to the first counter 510, multiplexer 560 toggles on every enable output from reset logic 550 and the integer value from the second counter 520 is captured in a register 248. Afterwards, a reset signal 554 is asserted by reset logic 550 into the second counter 520. When the next counter-start signal 224 occurs, the second counter 520 is enabled and begins to count whole cycles of the high speed oscillating clock; the first counter 510 holds its value captured in the register 248, the multiplexer 560 toggles and the integer count of high speed oscillating signals from the first counter during its enablement is saved to register 248. Then the first counter is reset by reset signal 552 from reset logic 550. The implementation of two or more counters in this way is a convenient implementation to count the number of high speed oscillating clock cycles in each and every reference clock cycle and simplifies storing and resetting the counter values.

Figure 6:
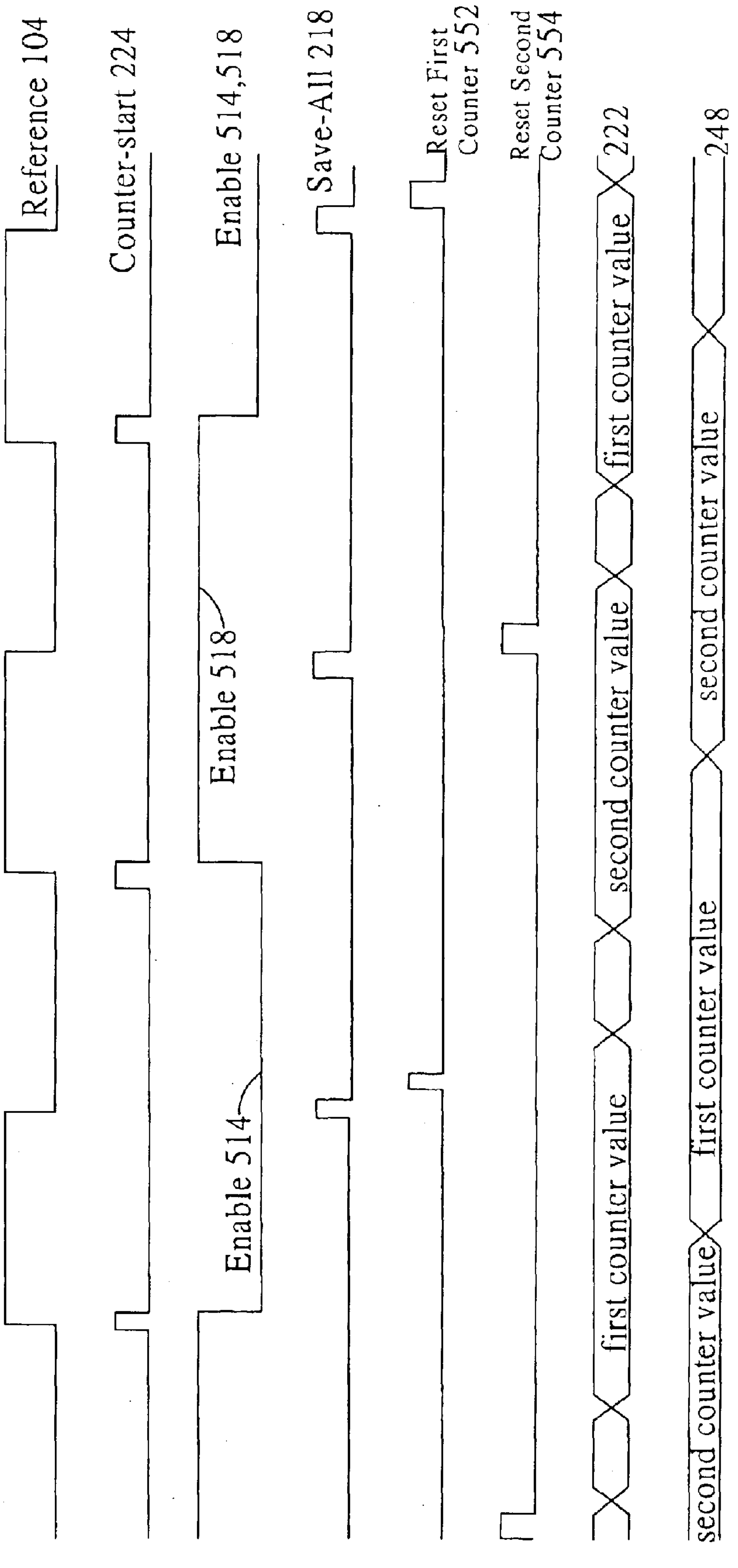
FIG. 6 illustrates the waveforms of two counters in the cycle counter of the time measurement unit in accordance with features of the invention.

FIG. 6 is a timing diagram of the cycle counter 220. The top waveform is the reference clock 104 input to the fraction measure block. Upon a rising edge of the reference clock, the edge-launcher 208 in the fraction measure block 210 generates a start-counter signal 224. Notice that each enable waveform 514, 518 has a duration of one reference clock cycle 104. Enable signal 514, 518 toggles between counters, i.e., when enable 514 is high, one counter is enabled and counting and the other counter is holding its value. When enable waveform 518 is high, the first counter is holding is value and the second counter is enabled counting. Every other save-all signal 218, also generated by the edge-launcher 208 in the fraction measure block 210, generates a reset signal 552 for the first counter; and on alternating cycles generates a reset signal 554 for the second counter. Prior to each reset pulse, the cycle counter will output 222 the value of alternating counters, i.e., as a result of the reset pulse 554 for the second counter, the values of the first counter are output at 222. Reset pulse 552 at the first counter causes the values of the second counter to be output 222 into the N+1 cycle counter 248 of the temporary register 240.

Figures 7A, 7B, 7C:
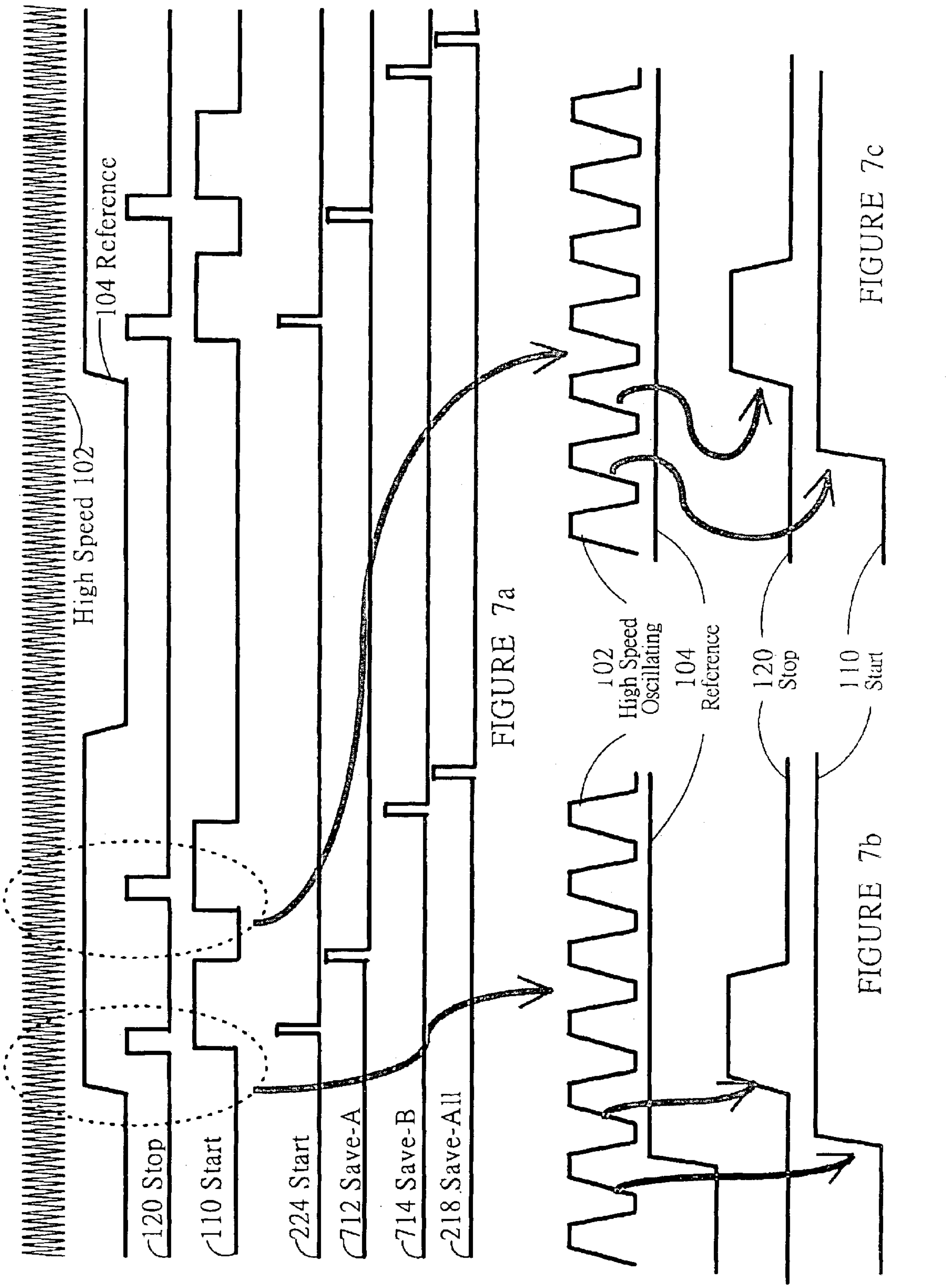
FIGS. 7*a*, 7*b*, and 7*c* are waveforms of how the edges of a reference signal and a high speed oscillating signal can be used to launch a start signal and a stop signal down their respective delay lines and obtain a calibration of the delay lines in accordance with features of the invention.
Figure 8:
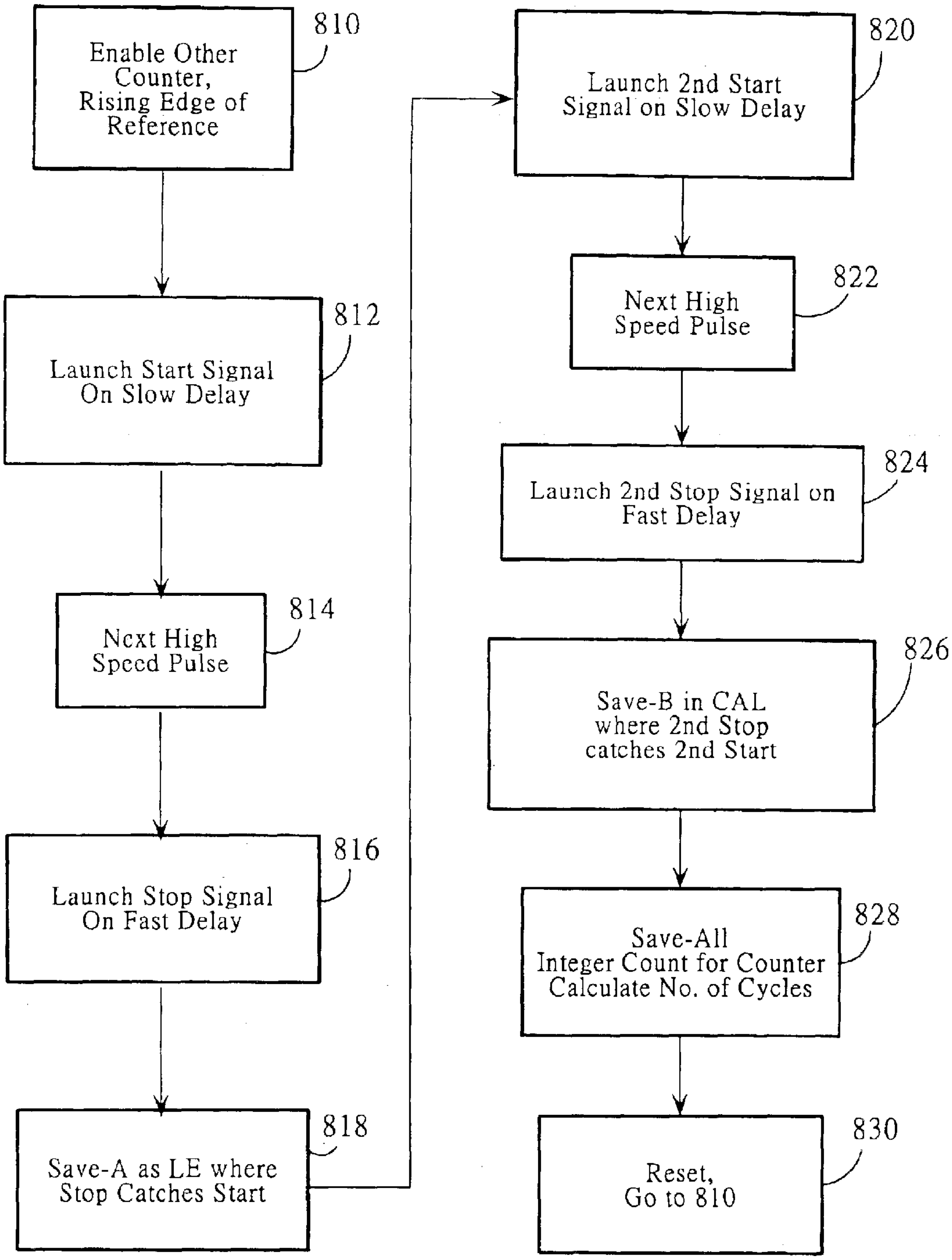
FIG. 8 is a simplified flow chart of a method to calibrate and obtain accurate time measurements in accordance with features of the invention. It is suggested that FIG. 8 be printed on the face of the patent.

Calibration of the delay lines is uniquely achieved by subtracting out the variations resulting from the environmental changes affecting the delay lines. Input and output waveforms for the calibration and measurements and the following-described method of calibration of the time measurement unit can best be understood by viewing FIGS. 7*a*, 7*b*, 7*c* and the method described as in FIG. 8 together. The sequence of the waveforms and hence, the measurement sequence, are controlled by the edge-launcher in the fraction measure block. The waveforms are shown in FIG. 7*b* detail the launching of the start and stop signals down their respective delay lines. FIG. 7*c* is a detail of how the calibration measurements are taken. A rising edge of a reference clock 104 is input into the edge-launcher as in step 810 of FIG. 8 which launches a start signal 110 down a slow delay line as shown in FIG. 7*b* and in step 812 of FIG. 8. Upon the next high speed oscillating clock 102 after the rising edge of the reference clock as in step 814 of FIG. 8, the edge-launcher sends a stop signal 120 down the fast delay line shown in FIG. 7*b* and in step 816 of FIG. 8. It is the stop signal 120 that latches the output of each delay unit on the slow delay line as explained above. In step 818, a Save-A signal pulses the linear-to-binary coder to save the binary number of the latch where the first stop caught the first start as the leading edge fraction $LE_{[n]}$ 244 in temporary storage register 240. A calibration code is then obtained as in FIG. 7*c*, a second start signal is launched down the slow delay line as in step 820 of FIG. 8. The next high speed oscillating clock at step 822 causes a fast signal to launch on the fast delay line, as in step 824 of FIG. 8. The binary number corresponding to the latch where the second stop signal on the fast delay line passes the second start signal on the slow delay line is one high speed oscillating clock cycle. Save-B signal pulses as in step 826 of FIG. 8, the linear-to-binary counter outputs the calibration count CAL 246 into the temporary storage register. Dividing the measured leading edge fraction by the calibration code gives units of high speed oscillating clock cycles. The previous leading edge fraction $LE_{[n-1]}$ 242 is obtained from a copy of the preceding leading edge fraction. When the Save-All signal 218 pulses in step 828 of FIG. 8, the value of the integer number of cycles from the cycle counter are saved in location 248 of the temporary storage 240. From FIG. 1 the period of the reference clock in units of high speed oscillating clock is given by following equation:

$$T = (N_{cycles} + 1) + \frac{(LE_{n-1}) - (LE_n)}{(CAL)}.$$

Note that any fractional fixed offset associated with the leading edge measurement is subtracted out thus compensating for temperature and voltage changes. The appropriate reset signal for the particular counter is generated in step 830 of FIG. 8, the next counter is enabled and the next reference clock starts the whole process again as in step 810 of FIG. 8. The output time value 250 can be used for several purposes, including accurate time measurements and/or programmable control of the high speed oscillating clock.

The various embodiments of the present invention described above have been presented by way of example and not limitation. The breadth and scope of the present invention is not limited by the included exemplary embodiments, but should be defined only in accordance with the following claims and their equivalents.

What is claimed is:

1. An apparatus to accurately measure time periods, comprising:

(a) a time measurement unit to receive an input of a reference clock and a high speed oscillating clock having a time period to be measured; the time measurement unit comprising:

(i) an edge-launcher that receives the reference clock and the high speed oscillating clock and in response thereto generates a plurality of signals;

(ii) a plurality of fast delay units arranged in a fast delay line, a plurality of slow delay units arranged in a slow delay line, and a plurality of latches; the first of the slow delay unit receiving a start signal generated by the edge-launcher, and the first of the fast delay units receiving a stop signal generated by the edge-launcher; one each slow delay unit interconnected with one each latch to one each fast delay unit, and the first of the slow delay unit to receive a second start signal and the first of the fast delay units to receive a second stop signal to obtain a calibration of the time measurement unit;

(iii) a plurality of combinatorial logic, one combinatorial logic receiving the output of one latch; and (iv) a linear-to-binary coder connected to the output of the plurality of combinatorial logic;

(b) a cycle counter having a plurality of counters; each counter to count and store the number of the high speed oscillating clock cycles within a time period of alternating reference clock cycles; and (c) a register to store the output of the linear-to-binary coder and the cycle counter.

2. The apparatus of claim 1, wherein the time measurement unit measures a leading fractional edge comprising the time difference between a rising edge of the reference clock and the next rising edge of the high speed oscillating clock.

3. The apparatus of claim 2, wherein the time measurement unit measures a next leading fractional edge comprising the time from a next rising edge of the reference clock and a rising edge of the high speed oscillating clock immediately following the next rising edge of the reference clock.

4. The apparatus of claim 3, further comprising reset logic to reset the time measurement unit, the cycle counter, and the linear-to-binary coder.

5. The apparatus of claim 4, wherein the time measurement unit and the linear-to-binary coder are reset every cycle of the reference clock.

6. The apparatus of claim 4, wherein each counter in the cycle counter is reset on alternating cycles of the reference clock.

7. The apparatus of claim 4, wherein the time measurement unit is calibrated every cycle of the reference clock.

8. The apparatus of claim 4, wherein the time measurement unit measures the number of cycles of the high speed oscillating clock that occur during every cycle of the reference clock.

9. A method to measure time periods, the method comprising the steps of:

(a) inputting a reference signal and a high speed oscillating signal into an edge-launcher of a time measurement unit;

(b) launching a start signal generated from the reference signal by the edge-launcher down a slow delay line;

(c) launching a stop signal generated from the high speed oscillating signal down a fast delay line;

(d) calibrating the time measurement unit;

(e) determining when the stop signal catches the start signal; and (f) counting the cycles of the high speed oscillating signal in each cycle of the reference signal.

10. The method of claim 9, wherein the step of determining when the stop signal catches the start signal further comprises:

(a) sampling a latch connecting an output of a slow delay unit on the slow delay line and also connecting an output of a fast delay unit on the fast delay line, the sampling occurring when the stop signal arrives at each fast delay unit on the fast delay line.

11. The method of claim 9, wherein the step of calibrating the time measurement unit further comprises:

(a) launching a second start signal on the slow delay line on a rising edge of the high speed oscillating signal but before a second rising edge of the reference signal;

(b) launching a second stop signal on the fast delay line on the next rising edge of the high speed oscillating signal after the second start signal is launched; and (c) determining when the second stop signal on the fast delay line catches the second start signal on the slow delay line.

12. The method of claim 11, wherein the step of determining when the second stop signal on the fast delay line catches the second start signal on the slow delay line further comprises:

(a) sampling a second output of a slow delay unit on the slow delay line as the second start signal traverses the slow delay unit in a latch connecting the slow delay unit and a fast delay unit on the fast delay line, the sampling of the second output occurring as the second stop signal travels down the fast delay line and catches the second start signal; and (b) decoding the latch of the second output when the second stop signal catches the second start signal in a linear-to-binary coder to yield a calibration value.

13. The method of claim 9, wherein the step of counting the cycles of the high speed oscillating signal in each cycle of the reference slow signal further comprises enabling a first counter to count the number of cycles of the high speed oscillating signal in a first cycle of the reference signal, and storing a count in a register, and then enabling a second counter to count the number of cycles of the high speed oscillating signal in a next cycle of the reference signal.

14. An apparatus to measure a high speed oscillating clock, comprising:

(a) means to input a reference clock;

(b) means to input the high speed oscillating clock;

(c) means to generate a start signal from the reference clock and a stop signal from the high speed oscillating clock;

(d) means to launch the start signal down a slow delay line and the stop signal down a fast delay line;

(e) means to detect when the stop signal on the fast delay line catches the start signal on the slow delay line;

(f) means to calibrate the apparatus using a second start signal launched down the slow delay line and a second stop signal launched down the fast delay line;

(g) means to measure the integer and the fractional cycles of the high speed oscillating clock during every cycle of the reference clock.

* * * * *